(12) United States Patent
Mori

(10) Patent No.: US 12,625,165 B2
(45) Date of Patent: May 12, 2026

(54) PROBE CARD

(71) Applicant: JAPAN ELECTRONIC MATERIALS CORPORATION, Hyogo (JP)

(72) Inventor: Chikaomi Mori, Hyogo (JP)

(73) Assignee: JAPAN ELECTRONIC MATERIALS CORPORATION, Hyogo (JP)

( * ) Notice: Subject to any disclaimer, the term of this patent is extended or adjusted under 35 U.S.C. 154(b) by 140 days.

(21) Appl. No.: 18/713,192

(22) PCT Filed: Dec. 6, 2021

(86) PCT No.: PCT/JP2021/044633
§ 371 (c)(1),
(2) Date: May 24, 2024

(87) PCT Pub. No.: WO2023/105553
PCT Pub. Date: Jun. 15, 2023

(65) Prior Publication Data
US 2025/0027973 A1 Jan. 23, 2025

(51) Int. Cl.
*G01R 1/073* (2006.01)
*G01R 1/067* (2006.01)
(52) U.S. Cl.
CPC ..... *G01R 1/07357* (2013.01); *G01R 1/06716* (2013.01); *G01R 1/07342* (2013.01)
(58) Field of Classification Search
CPC ........... G01R 1/07314; G01R 1/07357; G01R 1/06716; G01R 1/07342; G01R 1/073; G01R 1/06705; G01R 1/06733
(Continued)

(56) References Cited

U.S. PATENT DOCUMENTS 7,671,610 B2 * 3/2010 Kister ................ G01R 1/07314
324/750.16
2009/0280676 A1 11/2009 Weiland et al.
(Continued)

FOREIGN PATENT DOCUMENTS

JP 2001050982 A 2/2001
JP 2007033363 A 2/2007
(Continued)

OTHER PUBLICATIONS

Office Action issued in corresponding Korean Patent Application No. 10-2024-7016800 issued Apr. 29, 2025 (11 pages).
(Continued)

*Primary Examiner* — Roberto Velez
(74) *Attorney, Agent, or Firm* — Kilyk & Bowersox, P.L.L.C.

(57) ABSTRACT

[Problem] The objective is to provide a probe card that are less prone to contact failure, with good high-frequency characteristics, current endurance, and good conductivity. [Solution] A probe card includes a wiring board 10 formed with one or more probe electrodes 102, an upper guide plate 13 spaced below the wiring board 10 and facing the wiring board 10, formed with one or more upper guide holes 131, a lower guide plate 14 spaced below the upper guide plate 13 and facing the upper guide plate 13, formed with one or more lower guide holes 141, and a probe group 15G including two or more probes 15 that are inserted through a same upper guide hole 131 and a same lower guide hole 141 and connected to a same probe electrode 102 and a same electrode 201 of an object to be inspected, wherein the probes 15 of the probe group 15G are capable of independently each other buckling deformation between the upper guide plate 13 and the lower guide plate 14, and their lower
(Continued)

ends are capable of moving independently each other in a vertical direction.

8 Claims, 9 Drawing Sheets

(58) Field of Classification Search
USPC ........................................ 324/755.06, 756.03
See application file for complete search history.

(56) References Cited

U.S. PATENT DOCUMENTS

| | | | | |
|---|---|---|---|---|
| 2014/0197860 | A1* | 7/2014 | Hsu .................... | G01R 1/07357 |
| | | | | 324/756.07 |
| 2015/0160265 | A1 | 6/2015 | Nakamura et al. | |
| 2017/0242057 | A1 | 8/2017 | Mori et al. | |
| 2018/0052190 | A1 | 2/2018 | Perego et al. | |
| 2019/0041430 | A1* | 2/2019 | Park .................... | G01R 1/06738 |
| 2019/0393632 | A1* | 12/2019 | Ou .................... | H01R 13/2471 |
| 2022/0341969 | A1* | 10/2022 | Lou .................... | G01R 1/07378 |
| 2023/0143340 | A1* | 5/2023 | Ahn .................... | G01R 1/06755 |
| | | | | 324/754.01 |

FOREIGN PATENT DOCUMENTS

| | | | |
|---|---|---|---|
| JP | 2007155474 | A | 6/2007 |
| JP | 2009272308 | A | 11/2009 |
| JP | 2012093127 | A | 5/2012 |
| JP | 2017150864 | A | 8/2017 |
| JP | 2018044912 | A | 3/2018 |
| JP | 2018523095 | A | 8/2018 |
| JP | 2019152541 | A | 9/2019 |
| JP | 2019196984 | A | 11/2019 |
| KR | 10-2015-0002696 | A | 1/2015 |
| KR | 10-1640884 | B1 | 7/2016 |

OTHER PUBLICATIONS

International Search Report and Written Opinion issued in corresponding International Patent Application No. PCT/JP2021/044633 (with English translation of International Search Report) mailed Feb. 1, 2022 (7 pages).

* cited by examiner

PROBE CARD

This application is a National Stage Application of PCT/JP2021/044633, filed Dec. 6, 2021.

TECHNICAL FIELD

The present invention relates to a probe card, and more particularly to improvements in a probe card including vertical probes that are supported by two guide plates and generate elastic force by buckling deformation.

BACKGROUND OF THE INVENTION

A probe card is constituted by erecting numerous probes on a wiring board and is used as a testing device for the electrical characteristic inspection of semiconductor devices formed on semiconductor wafers. The inspection of semiconductor devices is performed by contacting the tips of the probes with electrode pads on the semiconductor wafer and conducting the semiconductor device and external devices.

When inspection is performed, the probe card and the semiconductor wafer are brought close to each other, and after the probes start contacting the electrode pads, an overdrive is executed to bring the probe card and semiconductor wafer even closer. The probes elastically deform due to the overdrive, biasing them towards the electrode pads. Therefore, by ensuring a certain amount of overdrive, it is possible to absorb variations in the height of the probes and electrode pads and reliably conduct all probes with the electrode pads.

Recently, with the acceleration of semiconductor devices, there is a demand for probe cards capable of performing inspections using high-frequency signals. To enhance the high-frequency characteristics of a probe card, it is necessary to shorten the length of the probes as much as possible to reduce their inductance. However, while shortening the probes and trying to ensure a certain amount of overdrive, it becomes necessary to bend the probes more significantly during overdrive. As a result, the probes may undergo plastic deformation beyond their stress limit and fail to maintain their elastic force. The maximum stress occurs on the outer side of the bent portion of the probe. Therefore, by reducing the thickness of the probe in the bending direction, it is possible to suppress the stress generated during overdrive and prevent plastic deformation.

FIG. 10 illustrates a schematic diagram showing an example configuration of a conventional probe card 300. The probe card 300 includes vertical probes 15 supported by two guide plates 13 and 14. The upper end of each probe 15 is connected to a probe electrode 102 on the main substrate 10, and the lower end contacts an object to be inspected. Also, probe 15 is inserted through two guide holes 131, 141 formed in the guide plates 13, 14, which are spaced at a certain interval, allowing elastic deformation between the guide plates. The corresponding two guide holes 131, 141 are offset, allowing probe 15 to be gently curved even when not inspecting and to buckle and maintain elastic force when inspecting (for example, Patent Literature 1).

FIG. 11 illustrates a schematic diagram showing an example configuration of a probe card 301 with improved high-frequency characteristics. Compared to FIG. 10, by shortening the distance between guide plates 13 and 14 and inserting shorter probes 15, it is possible to improve high-frequency characteristics. Also, by reducing the thickness of probe 15 in the buckling direction D, it can retain its elastic force during inspection even if the probe is shorter. However, reducing the thickness of probe 15 also reduces its cross-sectional area, leading to a decrease in current capacity and a new problem of reduced current endurance.

Therefore, probes have been proposed where a vertically elongated slit is formed in the middle region excluding both ends, and two or more layers of plates are spaced and arranged (for example, Patent Literature 2). By providing two or more layers of plates through the slit, it is possible to increase the current capacity while suppressing plastic deformation. However, the boundary between the slit and the ends is prone to breaking due to stress concentration during elastic deformation, leading to a new problem.

CITATION LIST

Patent Literatures

[Patent Literature 1] JP 2001-050982 A
[Patent Literature 2] JP 2009-272308 A

SUMMARY OF THE INVENTION

Technical Problem

Conventional probes have been used to establish electrical contact by touching their tips to the electrode pads of an object to be inspected. This poses a challenge when there are irregularities on the electrode pads, leading to reduced contact area, and also when tiny foreign substances on the electrode pads prevent effective contact.

FIG. 12 illustrates a situation where the tip of a conventional probe 15 contacts a protrusion 202 on the electrode pad 201. When there are irregularities on the surface of electrode pad 201, the tip of probe 15 may only contact the protrusion 202, failing to ensure sufficient contact area and potentially leading to reduced current capacity.

FIG. 13 illustrates a situation where the tip of a conventional probe 15 contacts a foreign substance 203 on the electrode pad 201. If there is a foreign substance 203 on the surface of electrode pad 201, the tip of probe 15 may only contact this foreign substance 203, risking failure to establish electrical conduct with electrode pad 201.

Furthermore, similar problems may arise concerning the connection between the upper end of probe 15 and the probe electrode 102.

The present invention has been made in view of the above problems, and its objective is to improve the reliability of a probe card. Specifically, it aims to provide a probe card that is less prone to contact failures. Furthermore, another objective is to provide a probe card with good high-frequency characteristics and current endurance, as well as good conductivity.

Solution to the Problem

A probe card of a first aspect of the present invention includes a wiring board formed with one or more probe electrodes, an upper guide plate spaced below the wiring board and facing the wiring board, formed with one or more upper guide holes, a lower guide plate spaced below the upper guide plate and facing the upper guide plate, formed with one or more lower guide holes, and a probe group including two or more probes that are inserted through a same upper guide hole and a same lower guide hole and connected to a same probe electrode and a same electrode of an object to be inspected, wherein the probes of the probe group is capable of independently buckling deformation between the upper guide plate and the lower guide plate, and their lower ends are capable of moving independently in a vertical direction each other.

Since such a configuration is adopted, it is possible to allow the probe to conduct reliably with the electrode pad even when the surface of the electrode pad of the object to be inspected is uneven or when foreign substance is present in some areas of the electrode pad. In addition, the reduction in the cross-sectional area of the probe can be mitigated by increasing the number of probes, thereby suppressing the reduction in current capacity, and improving high-frequency characteristics.

In addition to the above configuration, a probe card of a second aspect of the present invention is configured such that a friction reduction film is formed on a side surface of the probe.

This configuration prevents adjacent probes from interfering with each other due to friction.

In addition to the above configuration, a probe card of a third aspect of the present invention is configured such that the probe includes a locking part that locks onto an upper surface of the upper guide plate to prevent dislodgement from the upper guide plate.

In addition to the above configuration, a probe card of a fourth aspect of the present invention is configured such that the probe includes a side surface including a part facing an inner wall surface of the upper guide hole, and the locking part includes a protruding part provided on the side surface so as to lock onto the upper guide plate.

By adopting such a configuration, dropout of each probe can be prevented even when the probe group includes three or more probes.

In addition to the above configuration, a probe card of a fifth aspect of the present invention is configured such that the lower guide hole is formed offset to the upper guide hole, and the probe in non-inspection is curved between the upper guide plate and the lower guide plate.

This configuration allows each probe belonging to the same probe group to buckle and deform in the same direction, preventing interference between probes placed adjacent to each other.

Advantages of the Invention

According to the present invention, it is possible to improve the reliability of a probe card. In particular, it enables the provision of a probe card that is less prone to contact failures. Additionally, the invention allows for the provision of a probe card with good high-frequency characteristics and current endurance, as well as good conductivity.

DETAILED DESCRIPTION OF THE INVENTION

First Embodiment

Figure 1:
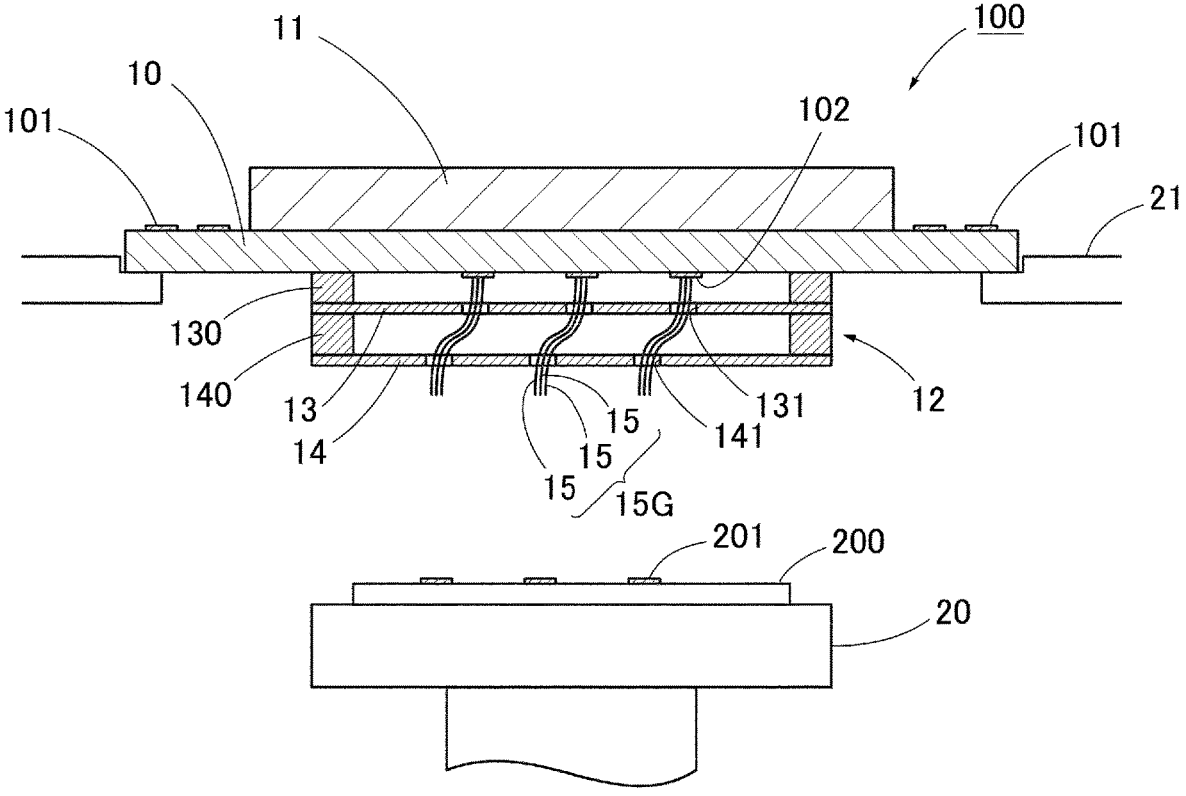
FIG. 1 illustrates an example configuration of a probe card 100 according to a first embodiment of the present invention.

FIG. 1 illustrates an example configuration of a probe card 100 according to a first embodiment of the present invention, being a cross-sectional view when the horizontally placed the probe card 100 is cut in a vertical plane. The probe card 100 is mounted on a card holder 21 in such a manner that a contact surface of probes 15 faces a semiconductor wafer 200 on a stage 20, and by moving the stage 20 up and down, the probes 15 can contact the electrode pads 201 on the semiconductor wafer 200.

The probe card 100 includes a main substrate 10, a reinforcing plate 11, a probe guide 12, and two or more probes 15.

The main substrate 10 is a wiring board that can be attached and detached from a wafer prober, for example, a disc-shaped glass-epoxy substrate. The outer edge of a lower surface of the main substrate 10 is supported by the card holder 21 of the wafer prober and is arranged horizontally. The reinforcing plate 11 is attached to the central part of the upper surface of the main substrate 10 to suppress its distortion, and two or more external electrodes 101, which connect to signal terminals of a tester device (not illustrated), are provided at the outer edge of the upper surface. Probe electrodes 102 for connecting the probes 15 are provided at the central part of the lower surface.

The probe guide 12 is a support member for the probes 15 that supports them for vertical movement and positions them in a horizontal plane. The probe guide 12 includes two guide plates 13, 14 that support the probes 15, and guide plate mounting parts 130, 140 that attach these guide plates 13, 14 to the main substrate 10.

The upper guide plate 13 is a plate-shaped member, for example, a ceramic plate, with upper guide holes 131 formed in it, and is arranged parallel to the main substrate 10 by the guide plate mounting part 130. The upper guide plate 13 is spaced below and faces the main substrate 10. The upper guide holes 131 are holes that penetrate the upper guide plate 13 in the thickness direction, through which the probes 15 are inserted, supporting the needle base parts of the probes 15.

The lower guide plate 14 is a plate-shaped member, for example, a ceramic plate, with lower guide holes 141 formed in it, and is arranged parallel to the main substrate 10 by the guide plate mounting part 140. The lower guide plate 14 is further spaced below the upper guide plate 13 and faces it. The lower guide holes 141 are holes that penetrate the lower guide plate 14 in the thickness direction, through which the probes 15 are inserted, supporting the needle tip parts of the probes 15 in a manner that allow vertical movement.

The probes 15 are vertical probes that extend in a direction crossing the main substrate 10 and buckle and deform due to overdrive. The probes 15 are made of a conductive material with an elongated shape, their upper ends connect the probe electrodes 102, and their lower ends contact the electrode pads 201 on the object to be inspected. The probes 15 are inserted through the upper guide holes 131 and further through the lower guide holes 141. Materials such as nickel (Ni) alloy, palladium (Pd) alloy, or other metals with both good elastic and conductive properties are used for the probes 15. The probes 15 may be formed solely of a single conductive material or may be layered with different conductive materials. For example, highly conductive metals like gold (Au) or copper (Cu) can be used in part.

A probe group 15G includes two or more independently arranged probes 15. Any probe 15 of the probe card 100 belongs to any probe group 15G. Probes 15 belonging to the same probe group 15G are inserted through the same upper guide hole 131 and connected to the same probe electrode 102. Probes 15 belonging to the same probe group 15G are inserted through the same lower guide hole 141 and contact the same electrode pad 201 on the semiconductor wafer 200. Probes 15 that belong to the same probe group 15G and are adjacent to each other are either arranged to touch each other at their sides or to be slightly spaced apart and face each other. That is the probe group 15G in the probe card 100 according to this embodiment corresponds to a single probe of the conventional probe card.

Figure 2:
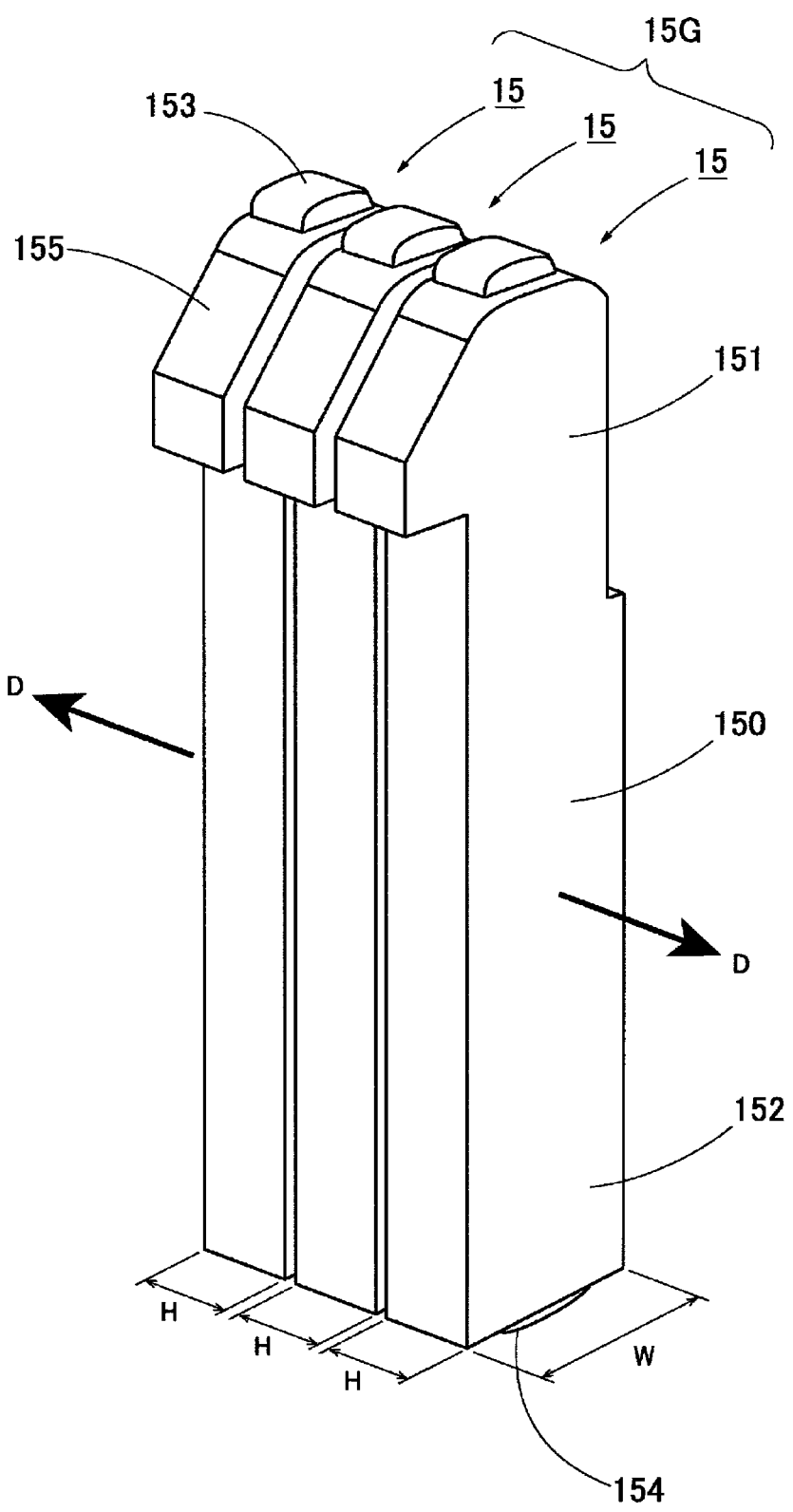
FIG. 2 illustrates a perspective view showing an example of the detailed configuration of a probe group 15G.
Figure 3:
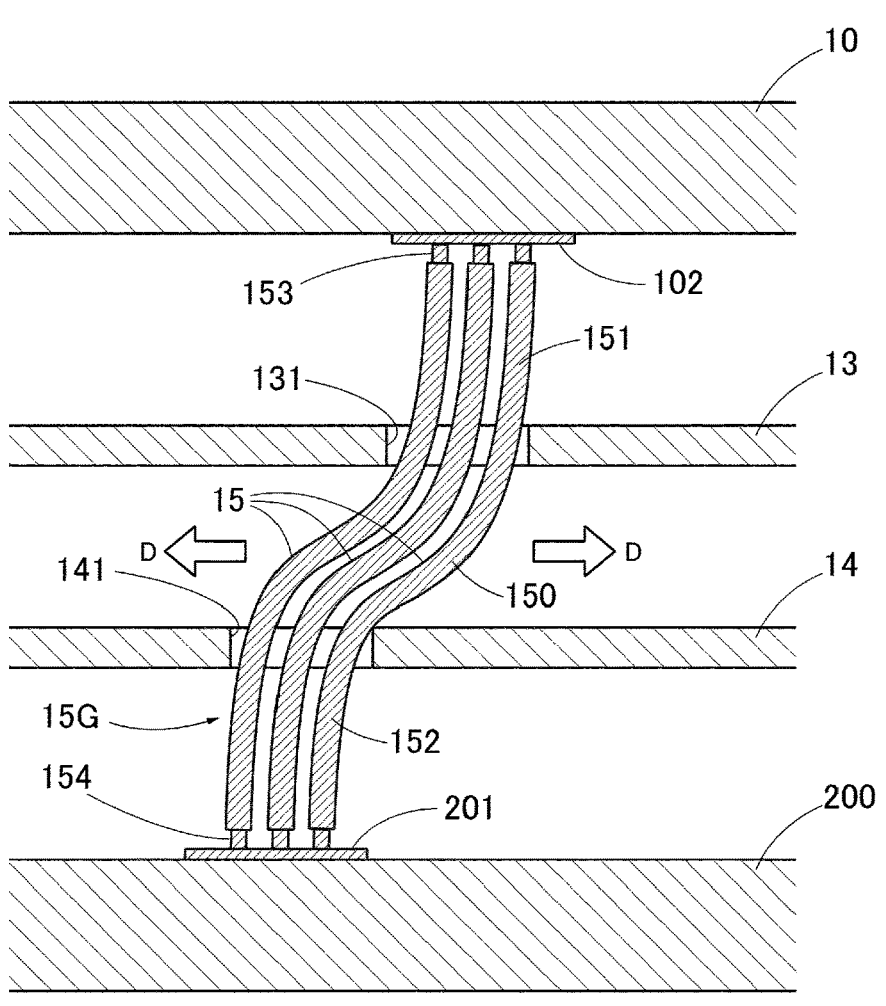
FIG. 3 illustrates a condition of each probe 15 during inspection, being a cross-sectional view when cut along the same vertical plane as in FIG. 1.
Figure 4:
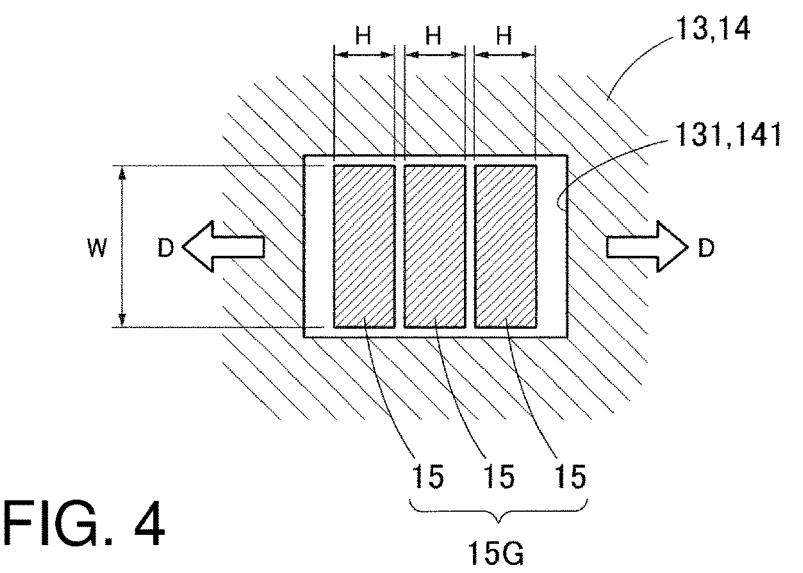
FIG. 4 illustrates a cross-sectional view when each probe 15 is cut through a horizontal plane passing through the upper guide plate 13 or the lower guide plate 14.
Figure 5:
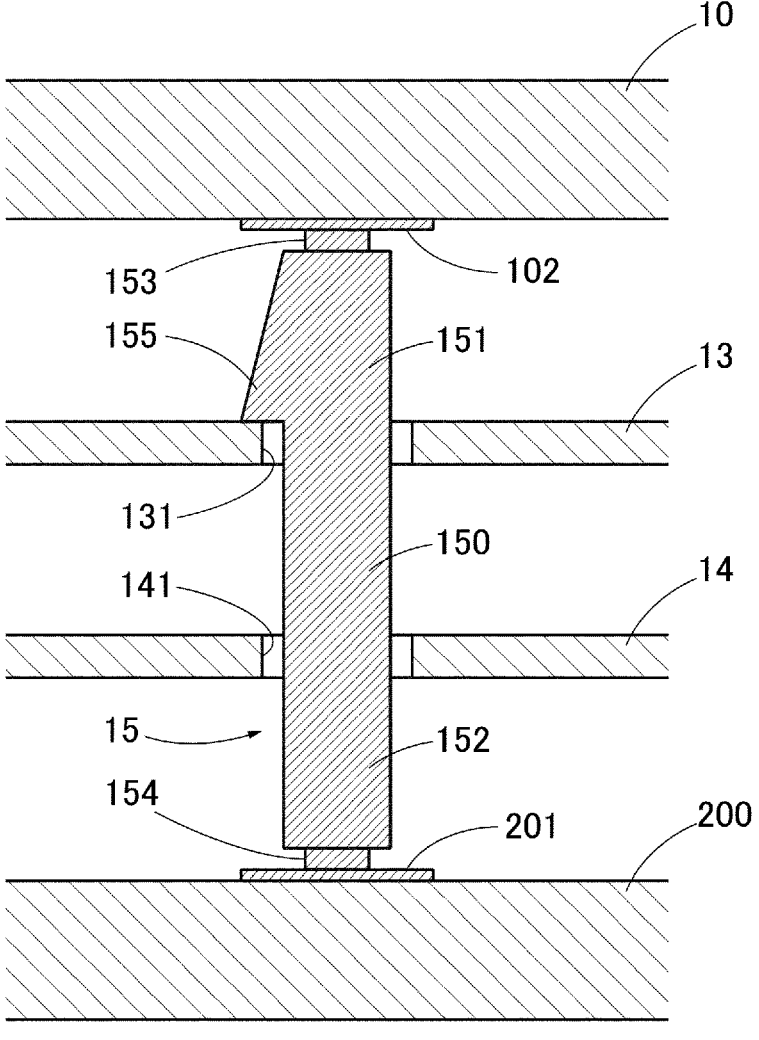
FIG. 5 illustrates a cross-sectional view when each probe 15 is cut along a vertical plane intersecting the cutting plane of FIG. 1.

FIG. 2 to FIG. 5 illustrate an example of the detailed configuration of the probe group 15G, showing three probes 15 forming one probe group 15G. FIG. 2 illustrates a perspective view showing the external shape of each probe 15. FIG. 3 illustrates a condition of each probe 15 during inspection, being a cross-sectional view when cut along the same vertical plane as in FIG. 1. FIG. 4 illustrates a cross-sectional view when each probe 15 is cut through a horizontal plane passing through the upper guide plate 13 or the lower guide plate 14. FIG. 5 illustrates a cross-sectional view when each probe 15 is cut along a vertical plane intersecting the cutting plane of FIG. 1.

The probe 15 includes a needle base part 151 at the upper part, a needle tip part 152 at the lower part, and an elastic deformation part 150 sandwiched between the needle base part 151 and the needle tip part 152. Additionally, the probe 15 includes a locking part 155 for preventing dislodgement.

The elastic deformation part 150 is positioned between the upper guide plate 13 and the lower guide plate 14 and buckles and deforms due to overdrive during inspection. A connection tip 153 for connecting to the probe electrode 102 of the main substrate 10 is provided at the end of the needle base part 151. A contact tip 154 for contacting the electrode pad 201 on the semiconductor wafer 200 is provided at the end of the needle tip part 152.

The upper guide hole 131 is offset in the buckling direction D relative to the lower guide hole 141 (refer to FIG. 3). The buckling direction D is a predetermined direction within the horizontal plane. For example, after inserting the probes 15 through both guide holes 131, 141 with their horizontal positions aligned, the guide plates 13, 14 can be slid relative to each other by a certain distance in the buckling direction D to achieve the offset arrangement. The buckling direction D is the horizontal direction on the vertical plane (buckling plane) where the probes 15 buckle and deform. Such offset arrangement allows the elastic deformation parts 150 of the probes 15 to be gently curved within the buckling plane even when in a straight, unbent shape. Therefore, during overdrive in inspection, the elastic deformation part 150 curves more significantly within the buckling plane, resulting in buckling deformation. The offset arrangement of guide plates 13, 14 predefines the buckling direction D of the probes 15, allowing the buckling direction D of each probe 15 in the same probe group 15G to be aligned with each other. Consequently, each probe 15 can buckle and deform independently without interfering with each other.

The probe 15, for example, is formed in a substantially rectangular prism shape (refer to FIG. 4). In this case, the cross-section of the elastic deformation part 150 is rectangular, having a thickness H aligned with the buckling direction D and a width W perpendicular to the buckling direction D. The thickness H is shorter than the width W. Reducing the thickness H allows the length of the probe 15 to be shortened while suppressing plastic deformation, thereby improving high-frequency characteristics.

However, reducing the thickness H decreases the cross-sectional area of the probe 15 and, consequently, its current capacity. By making the width W longer than the thickness H, the reduction in cross-sectional area and current capacity can be mitigated. Furthermore, by arranging two or more probes 15 aligned in the buckling direction D, the decrease in the cross-sectional area of one probe 15 can be alleviated or compensated by increasing the number of probes 15, ensuring sufficient current capacity.

The locking part 155 is a protruding part extending horizontally from the needle base part 151 and locks onto the upper surface of the upper guide plate 13, preventing the probe 15 from falling out of the upper guide plate 13 (refer to FIG. 5). The locking part 155 is formed as a protruding part extending on the side surface of the probe 15, which does not face the other probes 15 in the same probe group 15G, specifically on the side facing the inner wall of the upper guide hole 131. Preferably, the locking part 155 should be positioned to intersect the buckling direction D to prevent loosening and dislodgement from the upper guide plate 13 due to buckling deformation.

Figure 6:
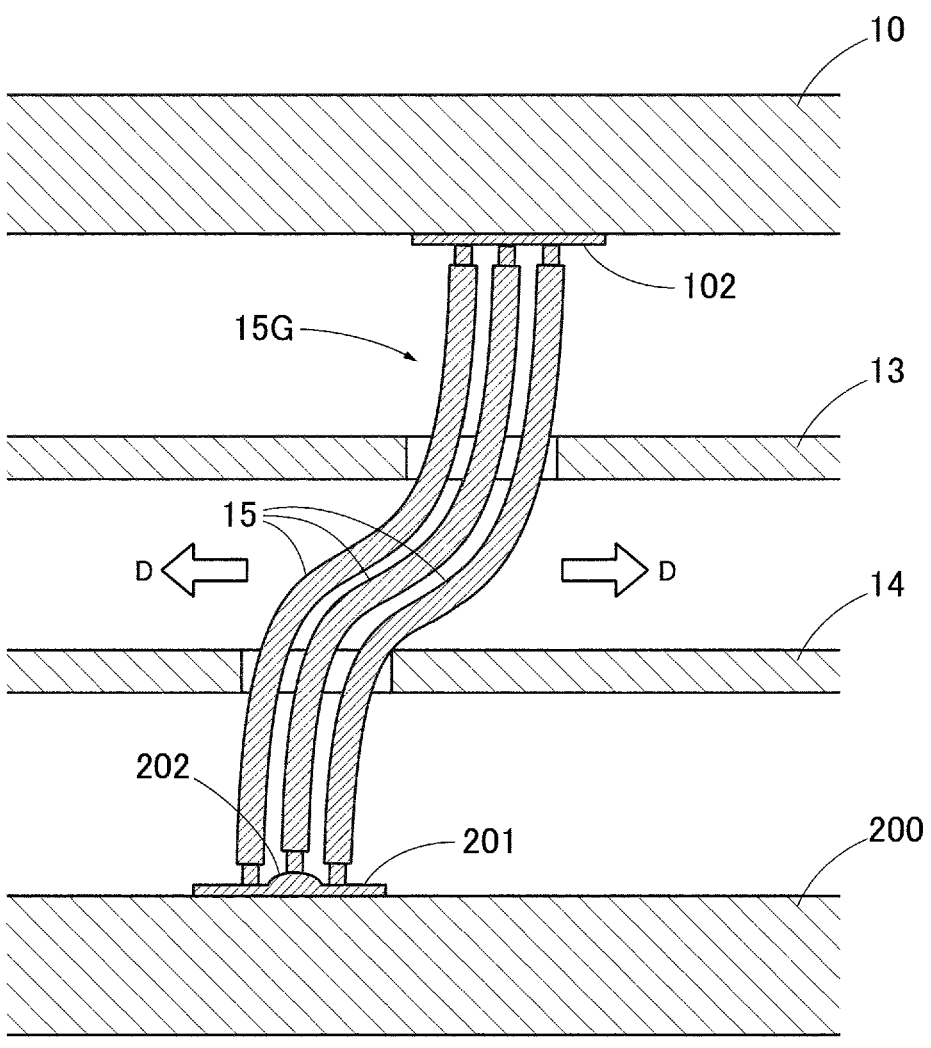
FIG. 6 illustrates a condition during inspection when there are irregularities on the electrode pad 201.

FIG. 6 illustrates a condition during inspection when there are irregularities on the electrode pad 201. In the probe card 100 according to the present embodiment, each probe 15 belonging to the same probe group 15G is configured to operate independently. Specifically, the needle tip parts 152 can move up and down independently, and the elastic deformation parts 150 can buckle and deform independently. Therefore, if irregularities are formed on the upper surface of the electrode pad 201, the height of the lower end of each probe 15 can be varied according to the shape of the upper surface, allowing all probes 15 to contact the electrode pad 201. This ensures sufficient contact area, improving the reliability of the inspection.

The electrode pad 201 has a protrusion 202 in part of its area, raised higher than other areas. The three illustrated probes 15 belong to the same probe group 15G, with the central probe 15 contacting the protrusion 202, and the probes 15 at both ends contacting areas other than the protrusion 202. That is, since all three probes are in contact with the electrode pad 201, sufficient contact area with the electrode pad 201 can be ensured.

Figure 7:
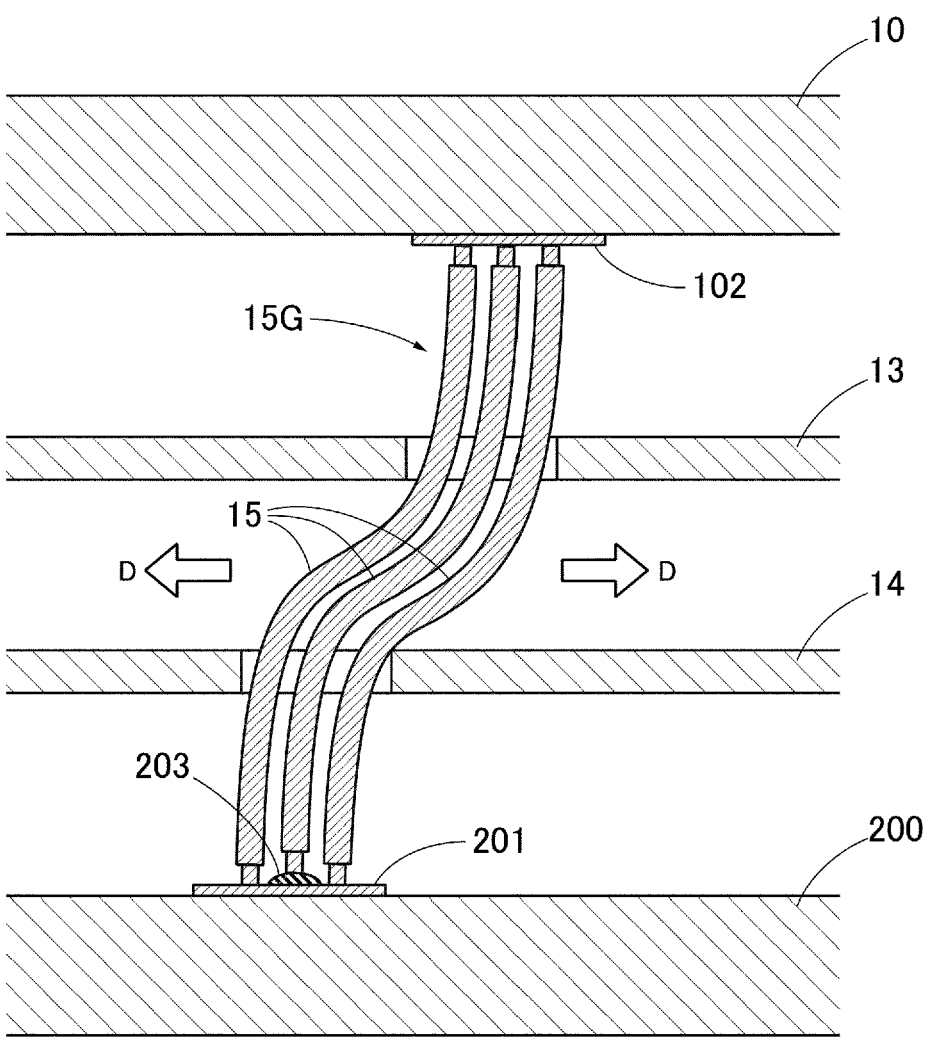
FIG. 7 illustrates a condition during inspection when there is a foreign substance 203 on the electrode pad 201.

FIG. 7 illustrates a condition during inspection when there is a foreign substance 203 on the electrode pad 201. Similar to the situation in FIG. 6, the height of the lower end of each probe 15 belonging to the same probe group 15G can be varied. Even if some probes 15 contact the foreign substance 203 on the electrode pad 201, other probes 15 can still contact the electrode pad 201. Therefore, even if there is an insulating foreign substance on the electrode pad 201, the probes 15 can be reliably conducted with the electrode pad 201, improving the reliability of the inspection.

Figure 8:
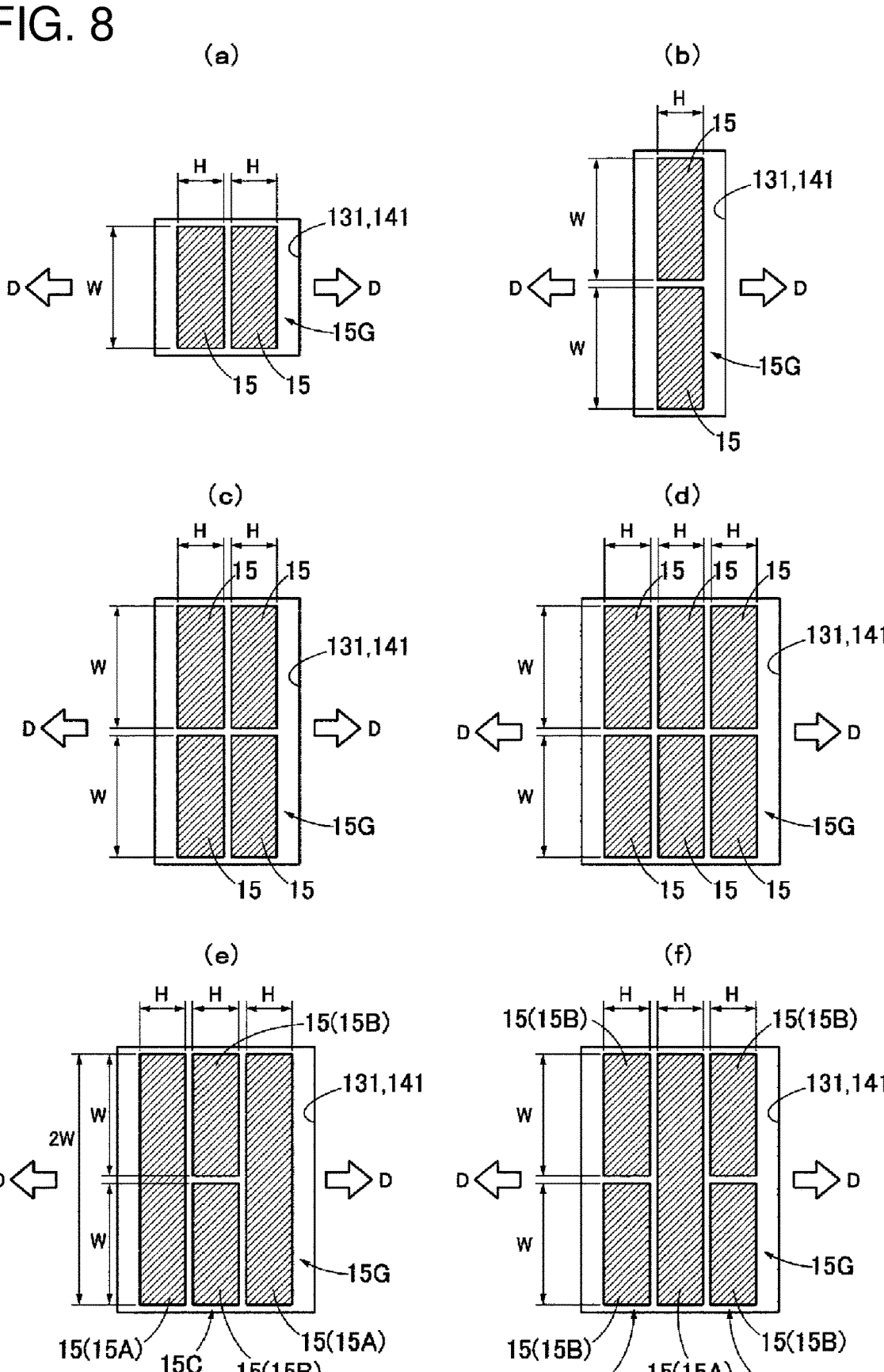
FIG. 8 illustrates another examples configurations of a probe group 15G.

FIG. 8 illustrates another example configurations (a) to (f) of the probe group 15G, with cross-sectional views of each probe 15 when cut through a horizontal plane passing through the upper guide plate 13 or the lower guide plate 14, similar to FIG. 4.

Each probe group 15G of the example configurations (a) and (b) includes two probes 15 arranged in a row. In the example configuration (a), two probes 15 are aligned in the buckling direction D, while in the example configuration (b), two probes 15 are aligned in a direction crossing the buckling direction D.

The probe group 15G of the example configuration (c) includes four probes 15 arranged in a grid. In the probe group 15G, two probes 15 are aligned in the buckling direction D, and two probes 15 are aligned in a direction crossing the buckling direction D.

The probe group 15G of the example configuration (d) includes six probes 15 arranged in a grid. In the probe group 15G, three probes 15 are aligned in the buckling direction D, and two probes 15 are aligned in a direction crossing the buckling direction D.

Each probe group 15G of the example configurations (e) and (f) include a wide probe 15A and a narrow probes 15B with different widths as a probe 15. The width 2W of the wide probe 15A is double the width W of the narrow probe 15B, and the total width 2W of two narrow probes 15B aligned in a direction crossing the buckling direction D is equal to the width 2W of the wide probe 15A. Here, for convenience, a pair of narrow probes 15B aligned in a direction crossing the buckling direction D is referred to as split probe 15C. Each probe group 15G of the example configurations (e) and (f) is configured by aligning a wide probe 15A and a split probes 15C in the buckling direction D. In the example configuration (e), two wide probes 15A are aligned in the buckling direction D, sandwiching a split probe 15C. Conversely, in the example configuration (f), two split probes 15C are aligned in the buckling direction D, sandwiching a wide probe 15A. The example configurations (e) and (f) are examples where one or more wide probes 15A and one or more split probes 15C are mixed and aligned in the buckling direction D.

Each probe 15 of the example configurations (a) to (f) includes a locking part 155 to prevent dislodgement. Therefore, each probe 15 needs to have a locking part 155 protruding so as to lock onto the upper guide plate 13 on the side surface including the part facing the inner wall surfaces of guide holes 131 and 141. When positioning the locking part 155 in a direction crossing the buckling direction D, it is arranged so that more than three probes 15 do not align in the direction crossing the buckling direction D. That is, in the buckling direction D, one or more probes 15 align, and in the direction crossing the buckling direction D, one or two probes 15 align.

In the example configurations (a) to (f), probes 15 belonging to the same probe group 15G all have the same thickness H, and the total width of probes 15 in the direction crossing the buckling direction D is the same for all. This prevents significant differences in the buckling deformation of each probe 15 and suppresses interference between adjacent probes 15.

Second Embodiment

Figure 9:
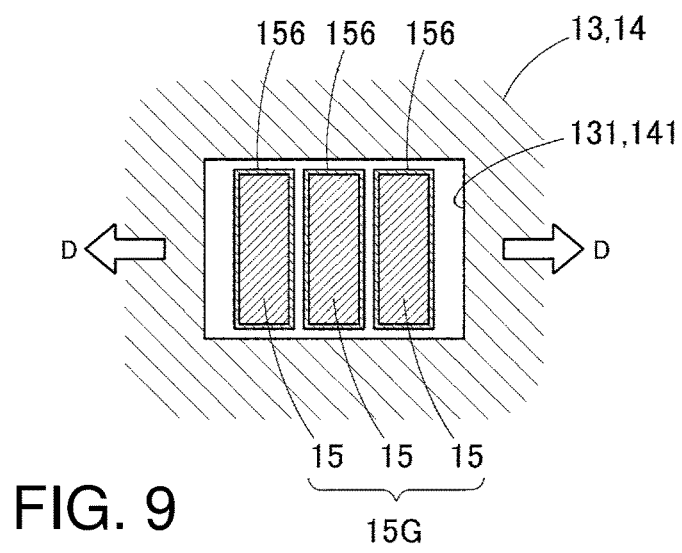
FIG. 9 illustrates an example of the main part of a probe group 15G according to a second embodiment of the present invention, being a cross-sectional view when each probe 15 is cut through a horizontal plane passing through the upper guide plate 13 or the lower guide plate 14.
Figure 10:
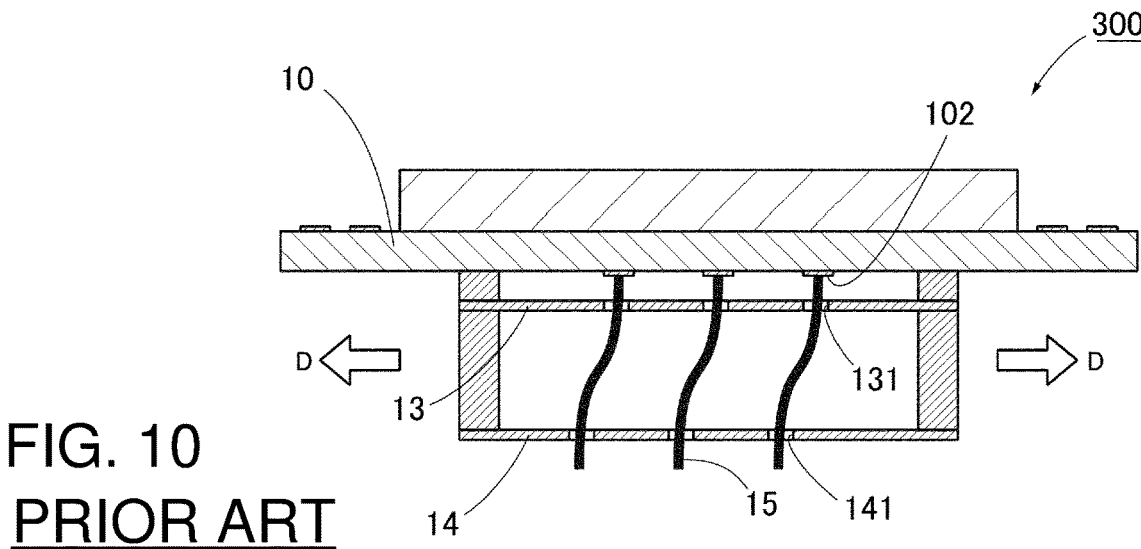
FIG. 10 illustrates a schematic diagram showing an example configuration of a conventional probe card.
Figure 11:
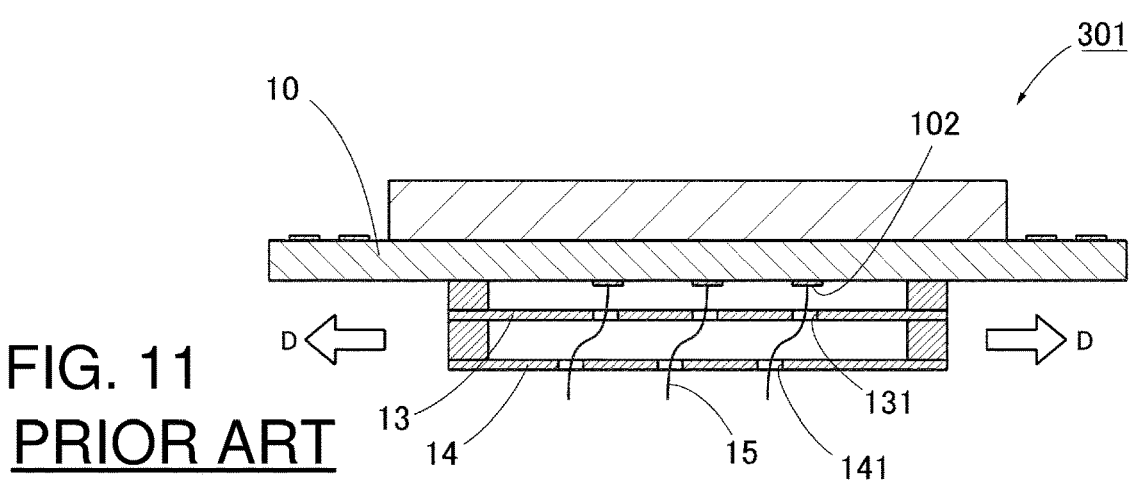
FIG. 11 illustrates a schematic diagram showing an example configuration of a conventional probe card with improved high-frequency characteristics.
Figure 12:
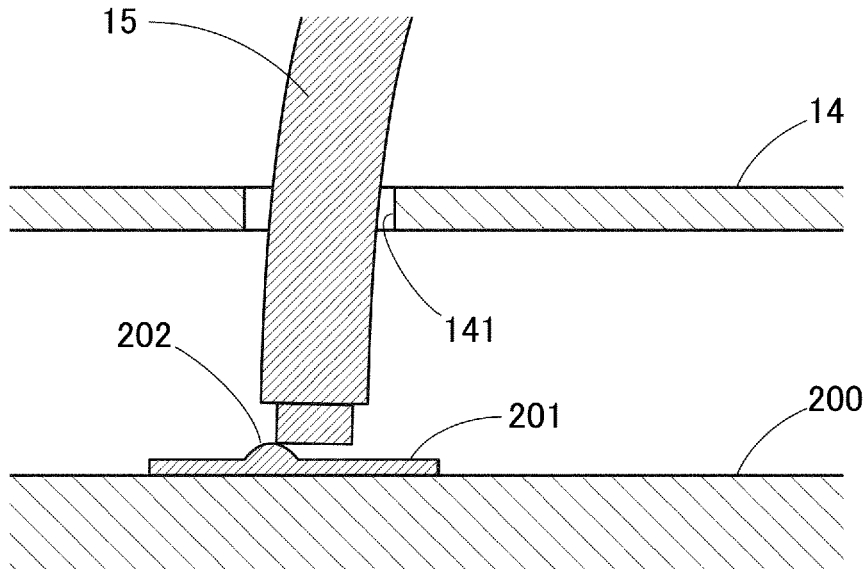
FIG. 12 illustrates a situation where the tip of a conventional probe 15 contacts a protrusion 202 on the electrode pad 201.
Figure 13:
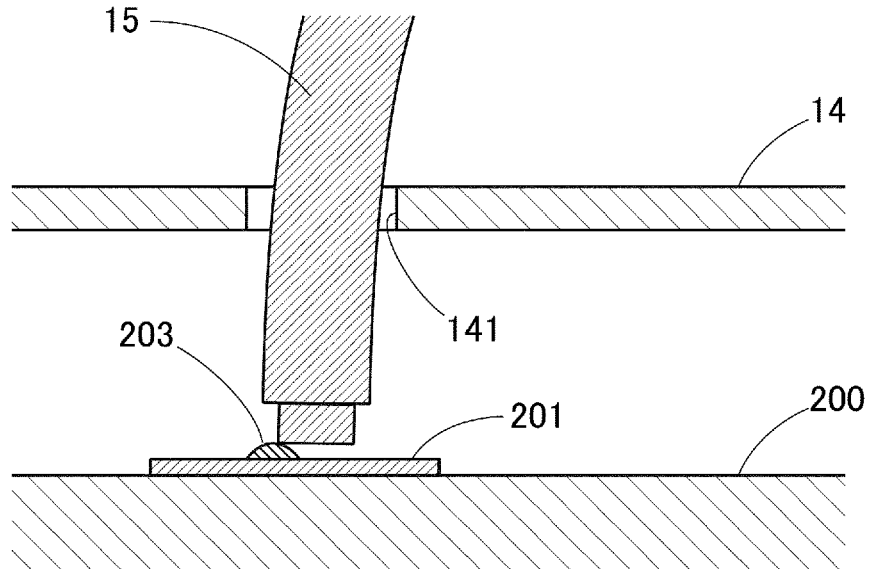
FIG. 13 illustrates a situation where the tip of a conventional probe 15 contacts a foreign substance 203 on the electrode pad 201.

FIG. 9 illustrates an example of the main part of a probe group 15G according to a second embodiment of the present invention, being a cross-sectional view when each probe 15 is cut through a horizontal plane passing through the upper guide plate 13 or the lower guide plate 14, similar to FIG. 4. A friction reduction film 156 is formed on the side surface of the probe 15.

The friction reduction film 156 is a film to prevent interference between adjacent probes 15, formed on the opposing side surfaces of the probes 15. For example, preferably, the film is formed so as to cover the entire circumference of the side surface of the probe 15, excluding the connection tip 153 and contact tip 154.

The friction reduction film 156 is embodied by forming a film on the side surface of the probe 15 with a material having a lower coefficient of friction than that of the side surface, such as a DLC (Diamond-Like Carbon) film or a PTFE (Polytetrafluoroethylene) film. A DLC film is an amorphous hard film made of hydrocarbon or carbon and has higher durability than a PTFE film. Therefore, using a DLC film as the friction reduction film 156 is preferred.

Since probes 15 belonging to the same probe group 15G are connected to the same probe electrode 102 and the same electrode pad 201, there is no need to insulate the probes 15 from each other. Therefore, the friction reduction film 156 needs not to be made of insulating material, but prioritizing reduction in friction coefficient, materials with lower conductivity than the probe 15 can be used.

By forming the friction reduction film 156 on the side surface of the probe 15, friction between adjacent probes 15 can be suppressed, preventing interference among independently moving probes 15.

REFERENCE SIGNS LIST

100 PROBE CARD
10 MAIN SUBSTRATE
101 EXTERNAL ELECTRODE
102 PROBE ELECTRODE
11 REINFORCING PLATE
12 PROBE GUIDE
13 UPPER GUIDE PLATE
130 GUIDE PLATE MOUNTING PART
131 UPPER GUIDE HOLE
14 LOWER GUIDE PLATE
140 GUIDE PLATE MOUNTING PART
141 LOWER GUIDE HOLE
15 PROBE
150 ELASTIC DEFORMATION PART
151 NEEDLE BASE PART
152 NEEDLE TIP PART
153 CONNECTION TIP
154 CONTACT TIP
155 LOCKING PART
156 FRICTION REDUCTION FILM
15A WIDE PROBE
15B NARROW PROBE
15C SPLIT PROBE
15G PROBE GROUP

20 STAGE
200 SEMICONDUCTOR WAFER
201 ELECTRODE PAD
202 PROTRUSION
203 FOREIGN SUBSTANCE
D BUCKLING DIRECTION

The invention claimed is:

1. A probe card comprising:
a wiring board formed with one or more probe electrodes;
an upper guide plate spaced below the wiring board and facing the wiring board, formed with one or more upper guide holes;
a lower guide plate spaced below the upper guide plate and facing the upper guide plate, formed with one or more lower guide holes; and
a probe group including two or more probes that are inserted through a common upper guide hole and a common lower guide hole, each probe of the probe group directly contacting a common probe electrode and a common electrode of an object to be inspected; wherein
the probes of the probe group are capable of independently each other buckling deformation in a predetermined direction between the upper guide plate and the lower guide plate, and their lower ends are capable of moving independently each other in a vertical direction, and
the two or more probes of the probe group are arranged to be aligned in the predetermined direction.

2. The probe card of claim 1, wherein a friction reduction film is formed on a side surface of the probe.

3. The probe card of claim 2, wherein
the lower guide hole is formed offset to the upper guide hole, and
the probe in non-inspection is curved between the upper guide plate and the lower guide plate.

4. The probe card of claim 1, wherein the probe includes a locking part that locks onto an upper surface of the upper guide plate to prevent dislodgement from the upper guide plate, and
the locking part protrudes from a needle base part at an upper part of the probe in a direction perpendicular to the predetermined direction.

5. The probe card of claim 4, wherein
the lower guide hole is formed offset to the upper guide hole, and
the probe in non-inspection is curved between the upper guide plate and the lower guide plate.

6. The probe card of claim 1, wherein a cross-section of an elastic deformation part is rectangular that has a short side in the predetermined direction and a long side perpendicular to the predetermined direction, the elastic deformation part being a part that buckles and deforms in the probe.

7. The probe card of claim 6, wherein
the lower guide hole is formed offset to the upper guide hole, and
the probe in non-inspection is curved between the upper guide plate and the lower guide plate.

8. The probe card of claim 1, wherein
the lower guide hole is formed offset to the upper guide hole, and
the probe in non-inspection is curved between the upper guide plate and the lower guide plate.

* * * * *